United States Patent [19]
Yamamoto et al.

[11] Patent Number: 4,841,461
[45] Date of Patent: Jun. 20, 1989

[54] FILTER ADJUSTMENT APPARATUS AND METHOD

[75] Inventors: Yoshihiro Yamamoto, Tokyo; Tsutomu Kume, Ibaraki; Nobuo Yamazaki; Fumiharu Hashimoto, both of Tokyo; Koichi Ohya, Kanagawa, all of Japan

[73] Assignee: Sony Corporation, Tokyo, Japan

[21] Appl. No.: 137,719

[22] Filed: Dec. 24, 1987

[30] Foreign Application Priority Data

Dec. 27, 1986 [JP] Japan ................. 61-315055
Dec. 27, 1986 [JP] Japan ................. 61-315053

[51] Int. Cl.$^4$ .......................... G06F 7/38; H03F 1/34
[52] U.S. Cl. .................................. 364/572; 328/167; 330/294; 364/571.01; 364/724.02; 375/13
[58] Field of Search ............... 375/13; 379/410, 411; 330/294, 307, 305; 333/17 R, 28 R, 172, 173; 328/167; 364/724.02, 724.19, 724.20, 571, 572, 571.01

[56] References Cited

U.S. PATENT DOCUMENTS

| | | | |
|---|---|---|---|
| 4,301,420 | 11/1981 | Sugawara | 330/305 |
| 4,320,517 | 3/1982 | Godard et al. | 375/13 |
| 4,339,729 | 7/1982 | Jason et al. | 330/294 |
| 4,438,406 | 3/1984 | McCormick et al. | 330/306 |
| 4,513,254 | 11/1985 | Harr | 330/294 |
| 4,554,514 | 11/1985 | Whartenby et al. | 330/294 |
| 4,745,622 | 5/1988 | Gupta | 330/294 |
| 4,768,205 | 8/1988 | Nakayama | 333/173 |

*Primary Examiner*—Parshotam S. Lall
*Assistant Examiner*—Kevin J. Teska

[57] ABSTRACT

A filter adjustment apparatus adjusts the properties of a filter by changing, for example, the circuit constants of a filter connected in series with a signal processing circuit to correspond with desired optimum properties of the filter. The state of the signal processing circuit is changed to a state not affecting the filter adjustment, to thereby eliminate the influence of the signal processing circuit on the filter characteristics, to facilitate and increase precision of the filter adjustment.

17 Claims, 14 Drawing Sheets

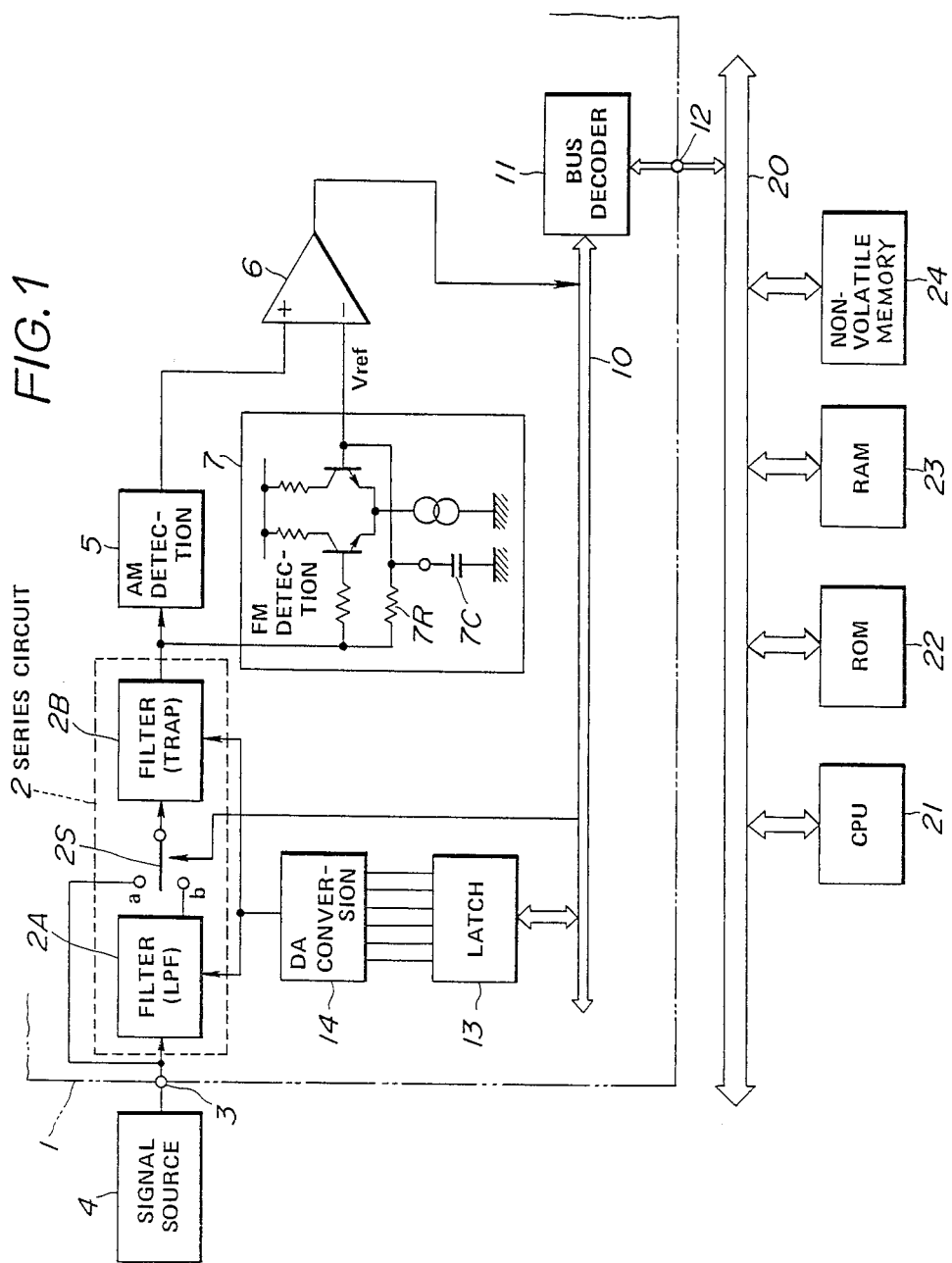

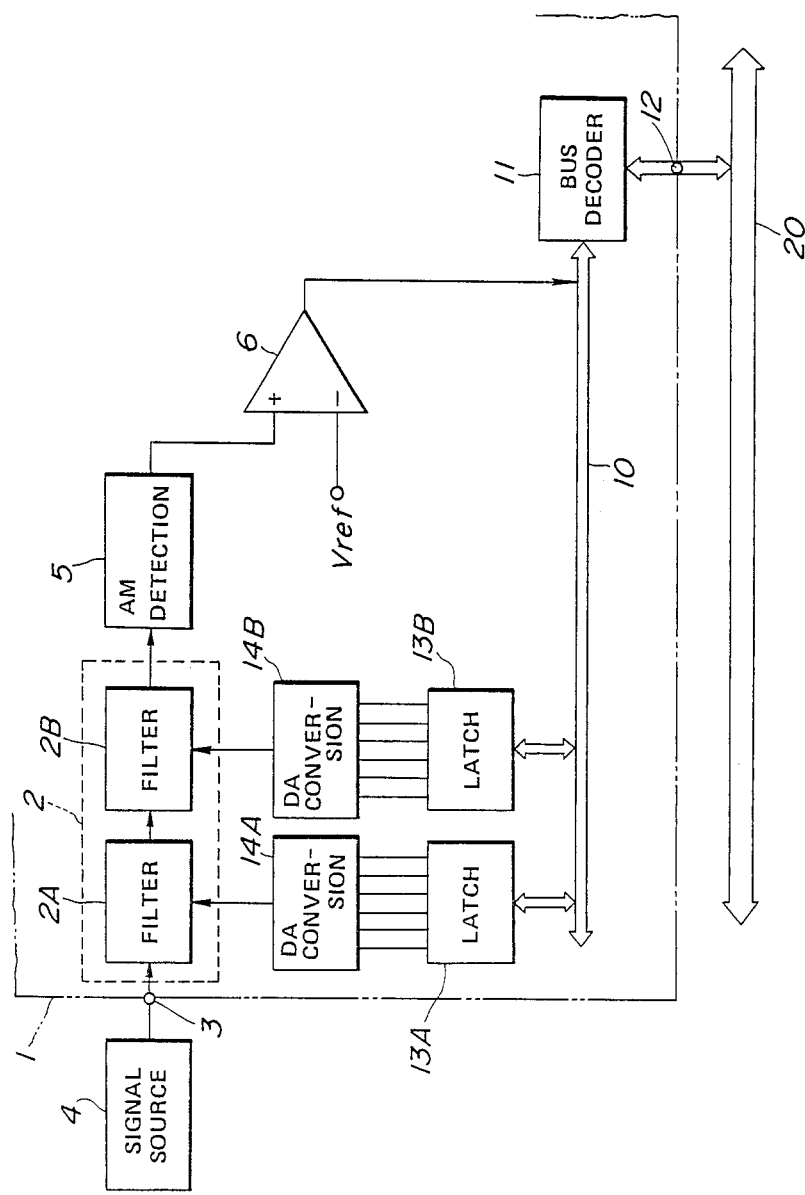

FILTER ADJUSTMENT APPARATUS AND METHOD

BACKGROUND OF THE INVENTION

1. Field of the Invention

This invention relates to a filter adjustment apparatus and method and more particularly to a device and method for adjusting a filter connected in series with a signal processing circuit or a filter connected in series with at least one other filter.

2. Description of the Prior Art

In a checking process for electronic circuits in general, it may become necessary to adjust the peak frequency, dip frequency or the cut-off frequency of the filter circuit to a prescribed target value. Above all, in a circuit formed in an analog integrated circuit or analog IC, while the circuit elements such as transistors, resistors or capacitors can be fabricated with a highly accurate relative ratio of the rated values thereof, the absolute values or magnitudes of these rated values vary from circuit to circuit. Hence, the aforementioned adjustment is thought to be indispensable in a filter circuit wherein a demand is raised for high accuracy.

In general, when carrying out the filter adjustment, the filter output is detected while the frequency of the input signals to the filter is continuously changed, by so-called sweeping, for finding the portions proper to the filter characteristics, such as the peak or dip on the frequency characteristic curve, and the frequency characteristics are changed until the frequency thereof coincides with the prescribed target values.

It is noted that, when adjusting the cut-off, peak or dip frequencies of a filter connected in series with one or more other filters or a filter connected in series with a signal processing circuit, the frequency characteristics of the series circuit including the filter will appear as the combined characteristics of the respective filters or as the combined characteristics of the filter and the signal processing circuit, so that it becomes difficult to check for portions proper to the filter characteristics, such as the aforementioned peak, dip or cut-off points. Above all, when the series filter circuit is provided in an integrated circuit, it is almost impossible to input or output signals into or from the respective filters or the signal processing circuit. In addition, since the adjustment of the respective filters is performed simultaneously by the common adjustment control signal, such that the frequency characteristics of the respective filters are changed simultaneously, the combined frequency characteristics are changed in a complicated way, so that it becomes more difficult to locate the portions proper to the filter characteristics, such as the aforementioned peak points. With increased difficulties in locating the characteristic portions, filter adjustment accuracy is undesirably lowered, while the labor and the time involved in the adjustment are increased.

OBJECT AND SUMMARY OF THE INVENTION

It is therefore an object of the present invention to provide a filter adjustment apparatus and method whereby the characteristic portions such as the peaks, dips or cut-off points on the filter frequency characteristic curve may be located by a simplified structure with increased adjustment accuracy and shortened adjustment time.

The filter adjustment apparatus and method according to the present invention is characterized in that it comprises a filter, the characteristics of which are adjusted in dependence upon the adjustment data, a signal processing circuit connected in series with said filter, and means for setting said signal processing circuit to a state not influencing said filter characteristics during the time of filter adjustment.

Said means may include causing said signal processing circuit to be by-passed so as not to affect the filter characteristics. The signal processing circuit includes other filters, emphasis circuits, modulator/demodulators or level control circuits.

BRIEF DESCRIPTION OF THE DRAWINGS

FIG. 1 is a block circuit diagram showing a filter adjustment apparatus according to an embodiment of the present invention.

FIG. 22 is a block circuit diagram showing a further modified embodiment of the present invention.

DESCRIPTION OF THE PREFERRED EMBODIMENTS

Figure 2A:
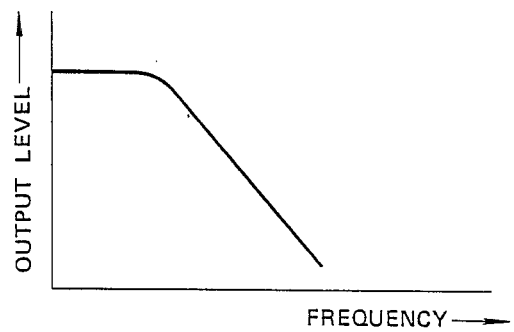
FIG. 2 is a chart showing the frequency characteristics for explaining the operation of FIG. 1.

FIG. 1 is a block diagram showing a filter adjustment apparatus according to a preferred embodiment of the present invention. In the present embodiment, the apparatus includes an analog integrated circuit 1, such as an IC for sound multiplex demodulation used for example in a television receiver. The IC includes a series circuit including a filter to be adjusted by the present device, for example a series circuit 2 mainly composed of a first filter 2A as the signal processing circuit and a second filter 2B to be adjusted by the present filter adjustment apparatus.

Referring to FIG. 1, signals from a signal source 4, such as sinusoidal waves, are supplied to the series circuit 2 through an exterior connection terminal 3, such as so-called IC pin, of the analog integrated circuit 1. To the filters 2A and 2B within the circuit 2, common filter adjustment data are supplied through a RAM 23, an external bus line 20, a bus decoder 11, an internal bus line 10, a latch 13 and a D/A converter 14 for changing their respective circuit constants, such as the current values of the constant current sources, for changing the filter characteristics. A bypass line is connected parallel to the filter 2A, or a signal processing circuit in general, and a changeover switch 2S, adapted for selective commutation between the filter 2A and the bypass circuit, is connected between the filter 2A and the next stage filter 2B. The switch 2S is commutated by a commutation signal supplied from a ROM 22 through an external line 20 and the internal bus line 20 within the IC. The input signal from the external connection terminal 3 is fed to a select terminal a of the changeover switch 2S through the bypass line, while the output from the filter 2A as the signal processing circuit is supplied to a select terminal b of the changeover switch 2S.

Figure 2B:
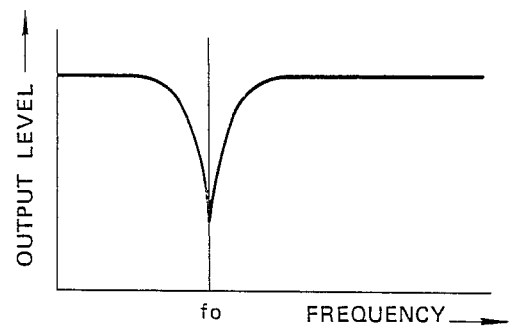
Figure 2C:
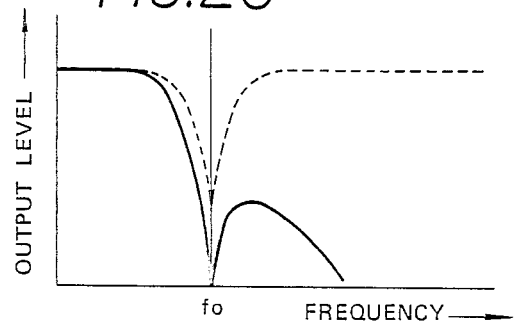

In the present embodiment, the filters 2A and 2B are assumed to have low pass filter characteristics as shown in FIG. 2A and what is called the trap characteristics as shown in FIG. 2B, respectively, as typical of the filter frequency characteristics. FIG. 2C shows the combined characteristics of the two filter characteristics. During filter adjustment, the changeover switch 2S is leveled to the side of the terminal b to by-pass the filter 2A such that the trap characteristics of the filter 2B will appear directly as the output characteristics of the series circuit 2, as indicated by a broken line in FIG. 2C. Since the dip frequency of the trap characteristics can be read easily and accurately, the dip frequency can be ultimately adjusted to the prescribed target frequency $f_0$ by way of performing the filter adjustment.

Filter adjustment in accordance with the output from the series circuit 2 can be made in various ways. According to the present embodiment, filter adjustment is performed in such a manner that the output from the series circuit 2 is supplied to, for example, an AM detector 5 as the level detecting means for detecting the signal level or amplitude, the so-detected AM output being supplied to one terminal, such as a non-inverting input terminal, of a comparator 6 for signal level discrimination. A prescribed reference level Vref is supplied to the other input terminal or an inverting input terminal of the comparator 6. In the comparator, it is determined whether the level of the detected AM output is higher or lower than the reference level Vref. According to the present embodiment, the reference level Vref is obtained from the low pass filter portion of the FM detector 7 provided in the analog IC 1. To this FM detector 7 is supplied the output from the series circuit 2, the direct current component of which is taken out by a low pass filter or LPF which is usually provided in an input stage side limiter amplifier of the FM detector. This low pass filter comprises an RC circuit composed of an input resistance 7R and a capacitor 7C, and the direct current signal is supplied as the reference level Vref to the comparator 6 through this low pass filter.

The output of comparison or the level discrimination output from the comparator 6 is supplied to the internal bus 10 within the IC 1. The bus decoder 11 connected to the internal bus 10 of the IC is also connected through a bus for external connection 12 to an external bus 20 and used as an interfacing circuit for mutual conversion of the data on the external bus 20 and those on the internal bus 10. The data transmitted from the external bus 20 through the bus decoder 11 to the internal bus 10 are stored once in a latch circuit 13 and then converted into analog signals in a D/A converter 14, the resulting analog signals being supplied to the respective filters 2A and 2B in the series circuit 2 as the circuit constant control signals or as the filter characteristic adjustment signals. To the external bus 20 are connected a CPU 21, such as a so-called microprocessor, the ROM 22 storing various programs and data, the RAM 23 for transient data storage and a non-volatile memory 24 for storage of data, such as the filter adjustment data, irrespective of the turning on or off of the power source. The computer system composed of the CPU 21, ROM 22, RAM 23 and the non-volatile memory 24 performs a series of control operations including storing the filter adjustment data depending on the outputs obtained from the comparator means when the filter adjustment data are changed, and determining the optimum filter adjustment data on the basis of the thus stored filter adjustment data.

The filter adjustment for finding the aforementioned filter adjustment data is now explained.

In making the filter adjustment in general, the aforementioned dip frequency may be detected on the basis of the filter output characteristic curve or the frequency response curve that is obtained when changing or sweeping the input signal frequency, with the frequency sweeping being repeated until the dip frequency is equal to the target frequency $f_0$ while adjusting the filter characteristics, as conventionally. There is however proposed in the present embodiment a system as shown in FIG. 1 wherein filter adjustment can be made automatically and precisely by a circuit of a simpler structure.

Briefly, the filter adjustment system is so designed the the optimum filter adjustment data are found on that basis of the filter adjustment data corresponding to the crossing of a prescribed reference level by the level detection filter output for changes caused in the filter characteristics with respect to the input signals fixed at the constant frequency $f_0$.

Figure 3:
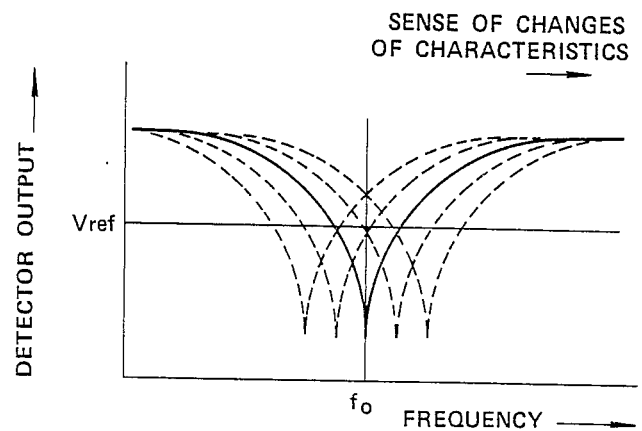
FIG. 3 is a chart showing the frequency characteristics for the trap filter.

For filter adjustment, the changeover switch 2S is leveled to the terminal a so that only the trap characteristics of the filter 2B as shown in FIG. 3 will be manifested as the characteristics of the circuit 2. The filter characteristics are then adjusted so that the dip frequency of the trap characteristics will be equal to the prescribed target frequency $f_0$. To the series circuit 2 are supplied signals at the constant frequency $f_0$ from the signal source 4. At this time, control means composed of the computer system including the CPU 21 transmit filter adjustment data to the control terminals of a constant current source $I_2$ of each of the filters 2A and 2B of the filter circuit 2. These adjustment data represent a series of data for gradually shifting the characteristic curves of the filter 2B in one direction, for example, in the arrow mark direction as schematically indicated by the dotted lines in the figure, on the frequency axis. It is noted that changing the frequency characteristics substantially continuously is tantamount to changing or sweeping the input signal frequency.

Figure 4:
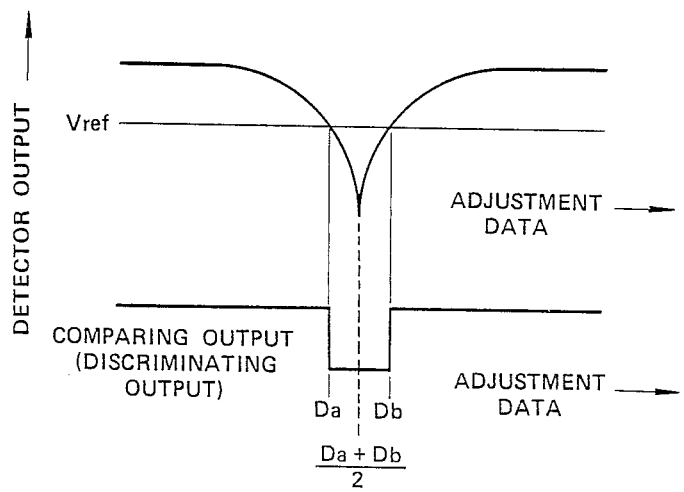
FIG. 4 is a chart showing an example of the adjustment operation of the trap filter.

Conversely, since the input signal frequency is fixed at the constant value $f_0$, the output obtained after level detection of the output signals from the filter 2 at the AM detector 5 is as shown for example at the detected output in FIG. 4. The detected output has its level changed in accordance with the changes in the filter adjustment data as indicated on the abscissa in FIG. 4. Thus, the curve of the detected output corresponds to the filter characteristic curve of FIG. 3 when supposed that the curve is inverted in the left and right direction in FIG. 3 with the frequency $f_0$ as the center. This detected output is supplied to the non-inverting input terminal of the comparator 6 for comparison with the reference level Vref to produce the comparator output as shown in FIG. 4. The filter adjustment data is obtained at the inverting position of the comparator output, that is, when the detected output crosses the reference level Vref, and are sequentially denoted as $D_a$ and $D_b$. The optimum adjustment data, when the dip frequency of the trap characteristics coincides with the aforementioned frequency $f_0$, is obtained from the mean value of the data $D_a$ and $D_b$, or $(D_a+D_b)/2$. This optimum adjustment data are written in the non-volatile memory 24 of FIG. 1 and preserved even when the power source is turned off. As one of the usual initializing operations performed at the time the power source is turned on, the aforementioned optimum adjustment data stored in the non-volatile memory 24 are transmitted to the latch circuit 13 through the buses 20 and 10 for establishing the optimum adjustment state of the filters 2A and 2B in the filter circuit 2.

It is possible with the above arrangement to eliminate the conventional frequency sweeping, while simplifying the circuit structure and shortening the time otherwise necessary for adjustment. In addition, it is possible to obtain the optimum filter adjustment data with high accuracy by a simpler circuit structure adapted for detecting the crossing point of the references level by the filter output, with the monitoring of the characteristic curve being also eliminated, while the circuit can be easily adapted to automatic adjustment with the use of the buses.

Figure 5:
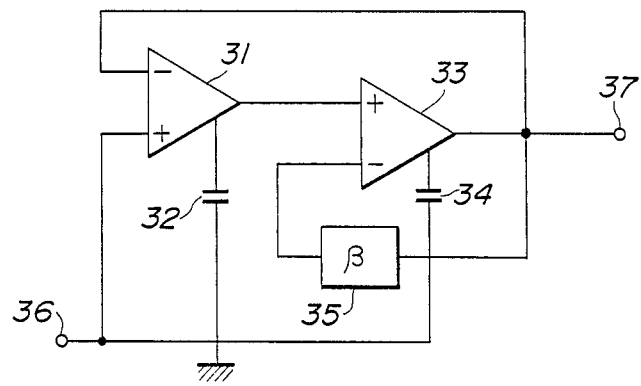
FIG. 5 is a block circuit showing an example of the biquad filter.

It is noted that, as the filters 2A and 2B incorporated into the integrated circuit, the so-called biquad filter as shown, for example, in FIG. 5, is most popular. The biquad filter is an active filter consisting of a series connection of a first integrator composed of an operational amplifier 31 and an integrating capacitor 32 and a second integrator composed of an operational amplifier 33 and a capacitor 34. The output of the operational amplifier 31 is supplied to the non-inverting input terminal of the operational amplifier 33 while the output of the operational amplifier 33 is fed back to the inverting input terminal of the operational amplifier 33 and the output of the operational amplifier 33 is fed back to the inverting input terminal of the operational amplifier 33 through a feedback circuit 35 having a feedback factor equal to $\beta$.

It is noted that the characteristics of BPF, LPF, HPF, trap or phase shifters can be realized by suitably selecting whether input signals should be supplied to the non-inverting input terminal of the operational amplifier 31 or to capacitors 32, 34, or the terminal or capacitors should be grounded.

In the embodiment shown in FIG. 5, input signals are supplied through the terminal 36 to the non-inverting input terminal of the operational amplifier 31 and to the capacitor 34 while the capacitor 32 is grounded and the output signals are taken at an output terminal of the operational amplifier 33 to provide a trap filter. The frequency characteristics of the trap filter are represented by a transfer function $$\frac{s^2 + 1}{s^2 + \beta s + 1}$$

where $s = j\frac{\omega}{\omega_o}$, $\omega_o = 2\pi f_0$, $\omega = 2\pi f$ and $f_0$ represents the trap frequency.

Also the input signals can be supplied only to the non-inverting input terminals of the operational amplifier 31, while both the capacitors 32, 34 can be grounded and the output signals taken out at the operational amplifier 33 to provide an LPF. The transfer function of the LPF is given by $$\frac{1}{s^2 + \beta s + 1}$$

where $s = j\frac{\omega}{\omega_o}$, $\omega_o = 2\pi f_0$, $\omega = 2\pi f$ and $f_0$ is the cut-off frequency of the low pass filter.

Figure 6:
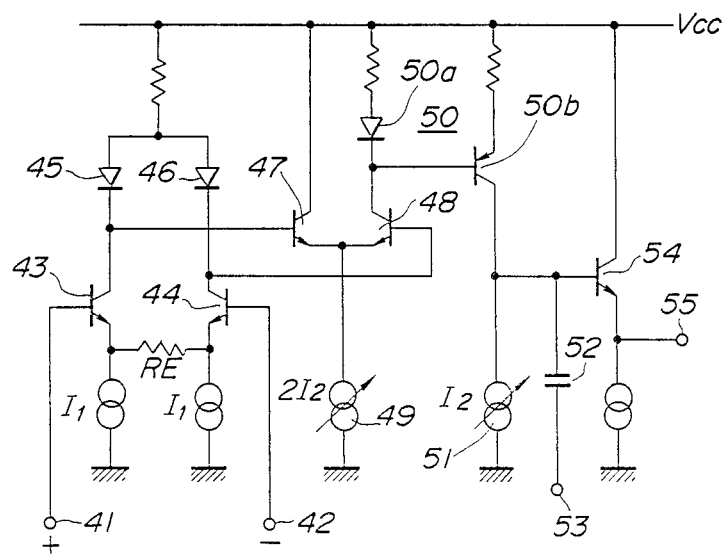
FIG. 6 is a circuit diagram showing a practical example of an integrator employed in the filter of FIG. 5.

FIG. 6 shows an example of an integrator used in the above biquad filter. Referring to FIG. 6, the non-inverting input terminal 41 and the inverting input terminal 42 of the operational amplifier are connected to the base terminals of transistors 43, 44 cojointly forming a differential amplifier. The current flows in a resistor $R_E$ connected between the emitters of these transistors 43, 33 with a magnitude related to the input voltage between the terminals 41 and 42. The current equal to the sum of the current $I_1$, $I_1$ of the constant current sources connected to the emitters of the transistors 43, 44 and the current equal to the difference between the currents $I_1$, $I_1$ flow respectively through diodes 45 and 46 connected to the collectors of the transistors 43, 44 respectively. The terminal voltages of these diodes 45, 46 appearing as a function of these currents are applied to the base electrodes of transistors 47, 48 cojointly forming an emitter common differential transistor pair. The common emitter of these transistors 47, 48 is grounded via a constant current source 49 of the current $2I_2$, such that the signal current flowing at the collector side of the differential transistor pair is amplified by a factor of $I_2/I_1$. The collector output of the transistor 48 is taken through a current mirror circuit 50 composed of a diode 50a and a transistor 50b for charging the capacitor 52 used as the aforementioned integration capacitance. The voltage at one end of the capacitor 52 is inputted to a transistor 54 so as to be taken at an output terminal 55. The other side 53 of the capacitor 52 may be grounded, as described above, an input signal is supplied thereto.

In the configuration of the integrating circuit shown in FIG. 6, changes in the current $I_2$ of the current source 51 on the output side of the current mirror circuit 50 and the constant current source 49 result in a parallel displacement of the characteristics curves along the frequency axis, as explained by reference to FIG. 3. This phenomenon is utilized for filter adjustment, as already described above.

It is noted that a variety of configurations can be envisaged for the constitution of the filters 2A and 2B making up the series circuit 2.

Figure 7A:
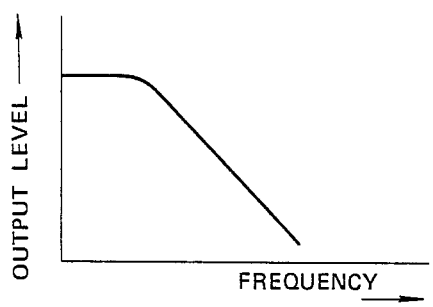
FIGS. 7A, B, and C are charts showing frequency characteristics of a series circuit of an LPF and a BPF.
Figure 7B:
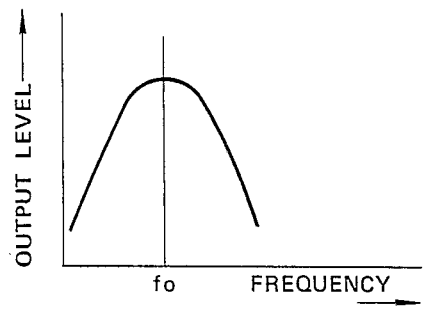
Figure 7C:
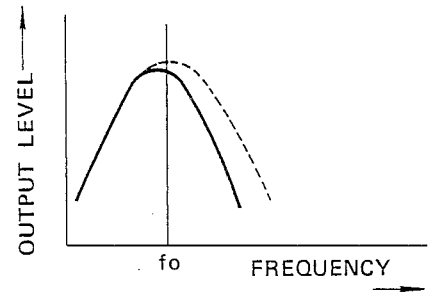

For example, when the LPF (i.e. the low pass filter) having the frequency characteristics shown in FIG. 7A is used as the first filter 2A and the BPF (i.e. the bandpass filter) having the characteristics shown in FIG. 7B is used as the second filter 2B, the combined filter characteristics are as shown by the solid line in FIG. 7c, such that it becomes difficult to check for the peak frequency $f_0$. Therefore, during the time of the filter adjustment mode, the first filter 2A is by-passed in the above described embodiment so that the BPF characteristics of the second filter 2B are directly manifested as the characteristics of the circuit 2, as indicated by the dotted line in FIG. 2c.

Figure 8:
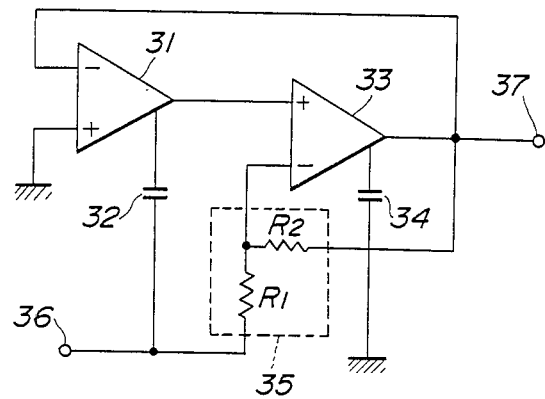
FIG. 8 is a block circuit diagram showing an example of constituting a BPF by a biquad filter.
Figure 10:
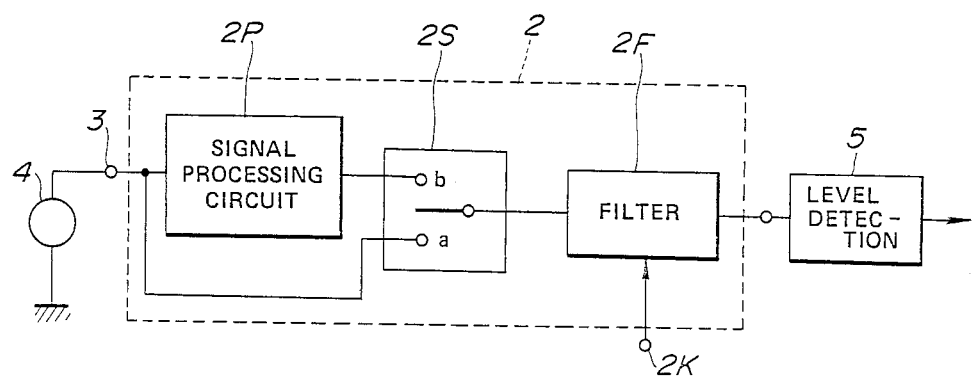
FIG. 10 is a block circuit diagram showing essential parts of an embodiment using a series circuit consisting of a signal processing circuit and a filter.

FIG. 8 illustrates an example of the aforementioned biquad filter for the realization of the bandpass filter. In this figure, parts or components same as those of FIG. 5 are indicated by the same numerals and the corresponding description is omitted. A feedback circuit 35 is composed of a voltage dividing circuit composed of resistors $R_1$ and $R_2$, with the resistor $R_2$ being connected to an output terminal of an operational amplifier 33 and the voltage output divided by the resistors $R_1$ and $R_2$ being fed back to an inverting input terminal of the operational amplifier 33. Both the non-inverting input terminal of the operational amplifier 31 and the capacitor 34 are grounded and the input signal is supplied through a terminal 36 to the capacitor 32 and the resistor $R_1$ to provide the BPF.

Figure 9A:
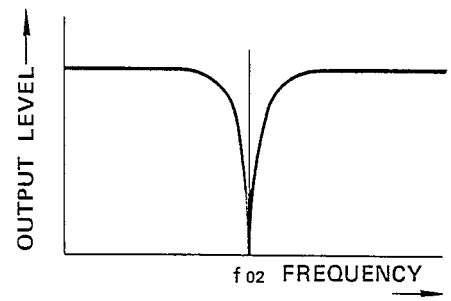
FIGS. 9A, B and C are charts showing frequency characteristics for explaining the frequency characteristics of a series circuit consisting of two trap type filters.
Figure 9B:
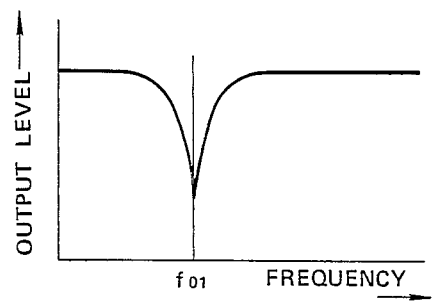
Figure 9C:
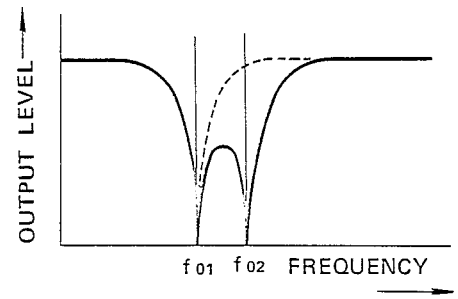

FIGS. 9A, 9B and 9C illustrate the characteristics of the filters 2A and 2B and the combined characteristics of the series circuit 2 for the case in which the filters 2A and 2B have trap characteristics of different dip frequencies $f_{02}$ and $f_{01}$. The arrangement is so made that the filter 2A is by-passed as described above so that the dip portion of the characteristics of the filter 2B is manifested substantially directly as the combined characteristics of the series circuit 2, as indicated by the dotted line in FIG. 9C.

It is also possible to envisage various other combinations, such as using BPFs or the BPF and the trap filter as the two filters.

The present invention may also be applied to a series circuit 2 composed of a filter 2F and a signal processing circuit 29 in general, such as the AM or FM modulators or demodulators, level controllers, equalizers or emphasis circuits. Similarly to the preceding embodiment, a by-pass line is provided parallel to the signal processing circuit 2 and a changeover switch 2S is provided for commutation between the circuit 2P and the filter 2F. During the filter adjustment, the changeover switch 2S is commutated to by-pass the signal processing circuit 2P so that the characteristics of the filter 2F will be displayed unambiguously. The aforementioned filter adjustment signals are supplied to the filter 2F through the adjustment control terminal 2K. The circuit may be configured otherwise in the same way as in FIG. 1.

Figure 11:
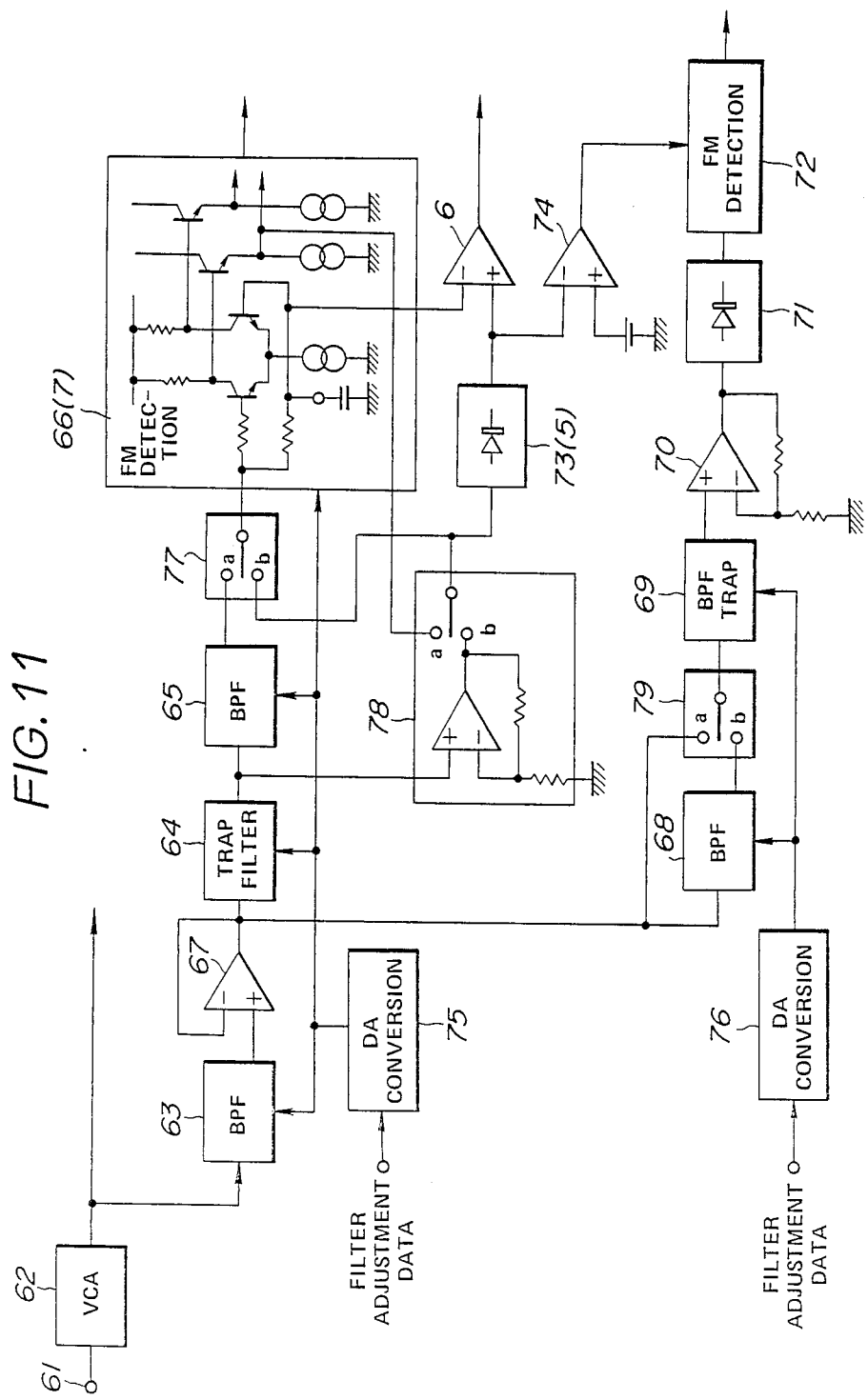
FIG. 11 is a block circuit diagram showing a practical example of an analog IC to which the present invention is applied.

The substantial parts of the integrated circuit (IC) for sound multiplex demodulation as a practical example of the analog IC for application of such automatic filter adjustment, are explained briefly by referring to FIG. 11.

In this figure, an input terminal 61 is used as a signal input terminal of an integrated circuit (IC) for sound multiplex demodulation. Thus, the sound multiplex signals obtained upon reception of the television sound multiplex broadcasting, for example, are supplied to the terminal 61. The sound multiplex signals supplied to the terminal 61 are amplified by a voltage controlled amplifier VCA) so as to be then supplied to a main signal system, a sub signal system and to a control signal system. The sub signal system has a BPF circuit composed of a BPF 63, a trap filter 64 and a BPF 65 and manifesting bandpass characteristics in its entirety, and an FM detector 66, and is so designed as to take out the output from the Fm detector 66 as the sub voice through an LPF circuit and a de-emphasis circuit, not shown. The control signal system is composed of a BPF 68 to which is supplied an output from an amplifier 67 connected between the BPF 63 and the trap filter 64, a filter 69 manifesting bandpass (BP) and trap characteristics, an AM detector 71 to which is supplied an output from the filter 69 through an amplifier 70, and an FM detector 72 to which is supplied an output from the AM detector 71. For more reliable detection of the sound multiplex mode, the output appearing in the vicinity of the output stage of the limiting amplifier of the FM detector 66 of the sub signal system is supplied to an AM detector for level detection and thence to a comparator circuit 74 for determining the presence or absence of the sound multiplex subcarrier. The output from the comparator 74 is supplied to an operation inhibit or defeat terminal of the FM detector 72 of the control signal system for controlling the FM detector 72 to an inoperative state in case the sound multiplex subcarrier is not detected.

In the circuit of FIG. 11, D/A converters 75, 76 are provided, as characteristic of the present embodiment. The function of the D/A converter 75 is to control the magnitude of the current of the aforementioned constant current source to thereby control the frequency characteristics of the FM detector 66 and the filters 63, 64 and 65 of the sub signal system, whereas that of the D/A converter is to control the frequency characteristics of the filters 68 and 69 of the control signal system. Changeover switches 77, 78 and 79 are connected between the FM detector 66 and the BPF 66 of the sub signal system, between the trap filter 64 and the AM detector 73 and between the BP and trap filter 69 and the BPF 68 of the control signal system, respectively, with a movable contact being shifted to the select terminals a and b for usual sound multiplex signal demodulation and for filter adjustment, respectively. That is, during the mode of demodulation of the sound multiplex signals the changeover switches 77, 78 and 79 are commutated to the side of the select terminal a, the output from the BPF 65 is supplied to the FM detector 66, the output of the limiting amplifier of the FM detector 66 is supplied to the AM detector 73 and the output from the BPF 68 is supplied to the BP and trap filter 69. During the mode of filter adjustment, as described hereinabove, the output from the trap filter 64 is amplified by an amplifier-changeover switch 78 so as to be then supplied to the AM detector 73 and the changeover switch 77, while the output from the changeover switch 77 is supplied to the FM detector 66 and the output from the amplifier 67 is directly supplied to the BP and trap filter 69 of the control signal system. During this filter adjustment, the BPF 65 of the sub signal system is by-passed while the output from the trap filter 64 is level-detected in an AM detector 73 corresponding to the AM detector 5 of FIG. 1 and transmitted to a comparator 6 where it is compared to the direct current level Vref from the RC circuit of the FM detector 66 corresponding to the FM detector 7 of FIG. 1. In the control signal system, the BPF 68 is by-passed so that the characteristics of the BP and trap filter 69 may be displayed more definately.

Figure 12:
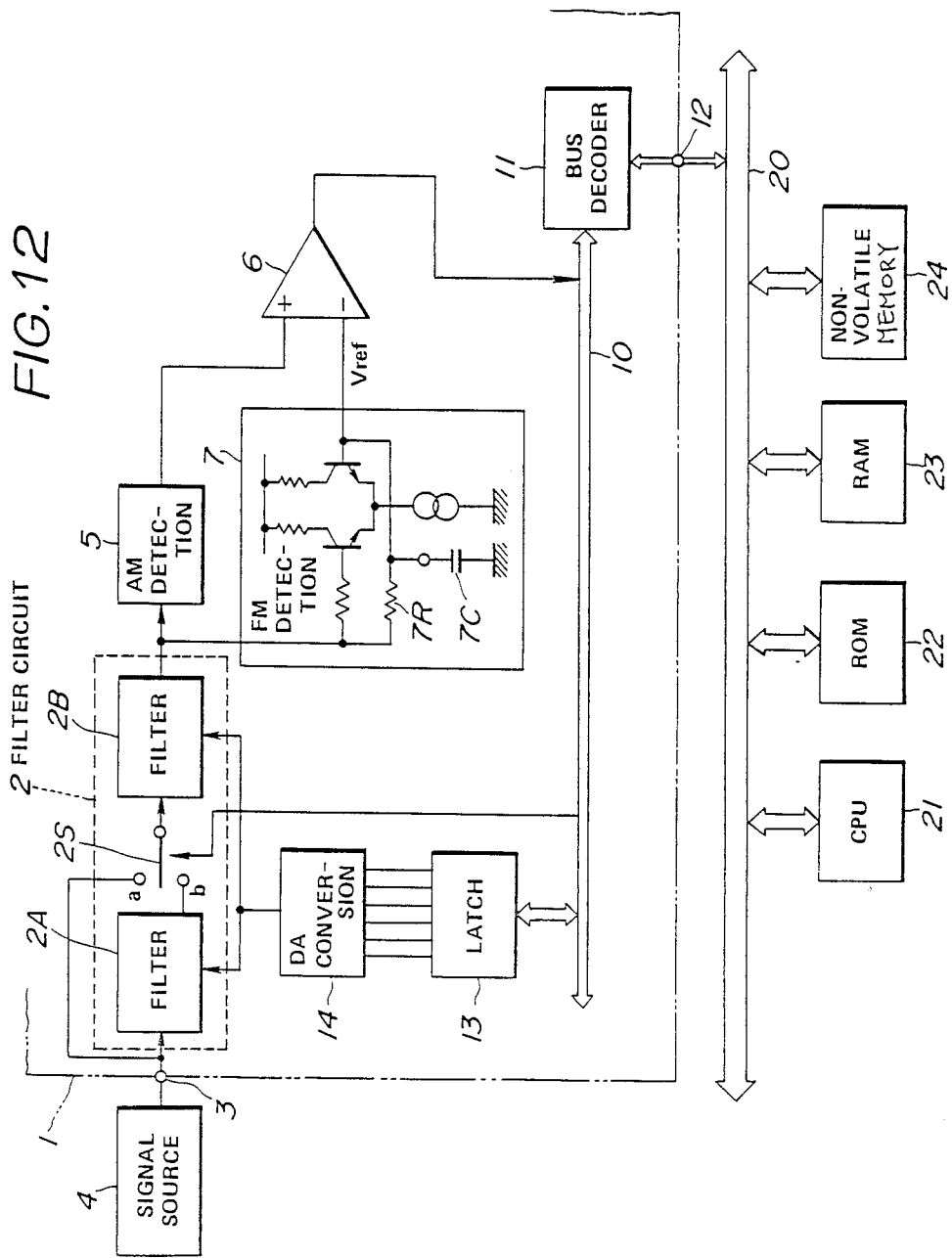
FIG. 12 is a block circuit diagram showing a filter adjustment device according to a modified embodiment of the present invention.

FIG. 12 shows in a block circuit diagram a filter adjustment device according to another embodiment of the present invention. The parts or components equivalent to those shown in FIG. 1 are depicted by the same reference numerals.

Figure 13A:
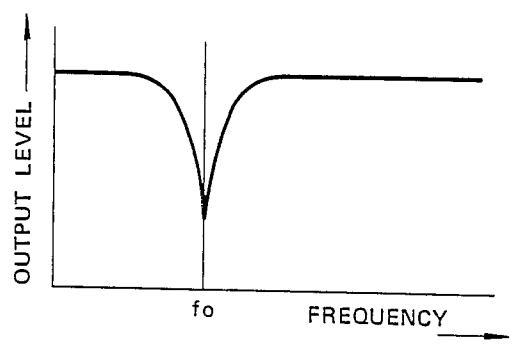
FIGS. 13A, B, and C are charts showing frequency characteristics for explaining the operation thereof.
Figure 13B:
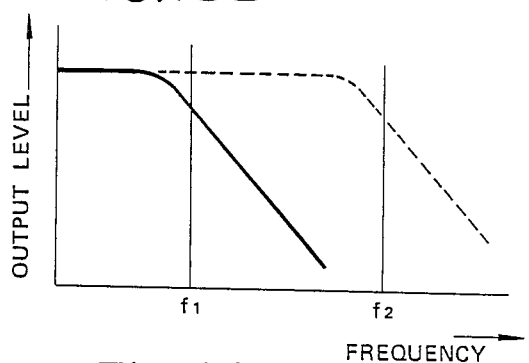
Figure 13C:
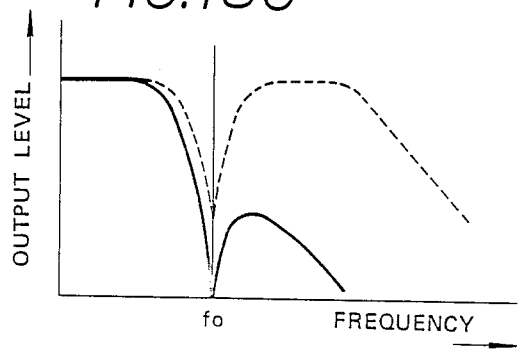

Referring more specifically to FIG. 12, a sinusoidal wave signal, for example, from the signal source 4 is supplied through a terminal for external connection of an analog IC, or a so-called IC pin, to the filter circuit 2 to be adjusted in accordance with the present invention. The two filters 2A and 2B of the filter circuit 2 are so designed that the circuit constants thereof, such as the current magnitude of the constant current source, are changed with the common filter adjustment data supplied from the D/A converter 14 as later described for changing the filter characteristics. At least one of the filters, for example, the filter 2B, can be commutated for drastically changing the filter characteristics. The frequency characteristics of the filter 2B when commutated in this manner are designed to reduce the effect on the characteristic portions of the frequecny characteristics of the other filter 2A, such as peaks, dip or cut-off points. In the present embodiment, the filters 2A and 2B of the filter circuit 2 are presumed to have the so-called trap characteristics as shown in FIG. 13A and the LPF characteristics as shown in FIG. 13B, respectively. The combined characteristics are as shown in FIG. 13C. By commutating the characteristics of the filter 2B as described hereinabove, the cut-off frequency of the LPB characteristics are shifted towards the higher frequency as indicated by dotted line in FIG. 13B so that the dip portion of the trap characteristics of the filter 2A is completely included within the passband of the LPE characteristics. The combined characteristics of the filter circuit 2 thus commutated are such that, as indicated by a broken line in FIG. 13C, the dip portion of the trap characteristics of the filter 2A is manifested more definitely so that the dip frequency can be read more easily and precisely and hence the filter adjustment can be made more easily and with high precision when ultimately adjusting the dip frequency to the preselected frequency $f_0$.

The operation of the present embodiment is otherwise the same as in FIG. 1 so that the detailed description is not made herein for simplicity.

Referring now to the commutation of the characteristics of the filter 2B having, for example, the LPF characteristics as described above, it is made by commutating the internal circuits of the filter as by a switch in such a fashion that the filter characteristics are vitally changed from those having a cut-off frequency f1, as indicated by the solid line in FIG. 13B, to those having a cut-off frequency f2, as indicated by the dotted line therein. In the integrating circuit shown in FIG. 6, commutation of the filter characteristics can be achieved by commutating the capacitance C of the capacitor 52 or integration capacitance, commutating emitter resistance $R_E$ of the input stage to modify the mutual conductance gm or by commutating the $I_1/I_2$ ratio equivalent to the gain of the operational amplifier.

Figure 14:
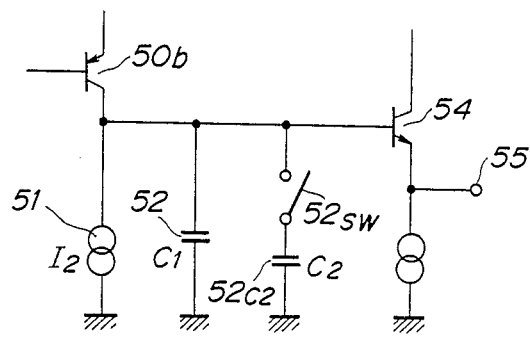
FIGS. 14 to 17 are circuit diagrams showing practical exemplary circuits for commutation of filter characteristics.

FIG. 14 shows a typical circuit for commutating the integration capacitance. Referring to this figure, a series circuit consisting of a switch $52_{SW}$ and a capacitor $52_{C2}$ is connected in parallel with the capacitor 52 of the integrated circuit of FIG. 6 and the switch 52sw is turned off or on according as the filter adjustment is or is not performed respectively, for thereby commutating and changing the LPF characteristics. With capacitances $C_1$ and $C_2$ of the capacitors 52 and $52_{C2}$, the switch $42_{SW}$ is turned on during the normal operation, with the filter adjustment not being made, and the cut-off frequency $f_{C1}$ of the LPF characteristics is given by $$f_{C1} = \frac{I_2}{2\pi(C_1 + C_2)R_E I_1}$$

During the time of filter adjustment, the switch $52_{SW}$ is turned off, and the cut-off frequency $f_{C2}$ is given by $$f_{C2} = \frac{I_2}{2\pi C_1 R_E I_1}$$

while commutation is made to LPF characteristics as indicted by the dotted line in FIG. 13B.

Figure 15:
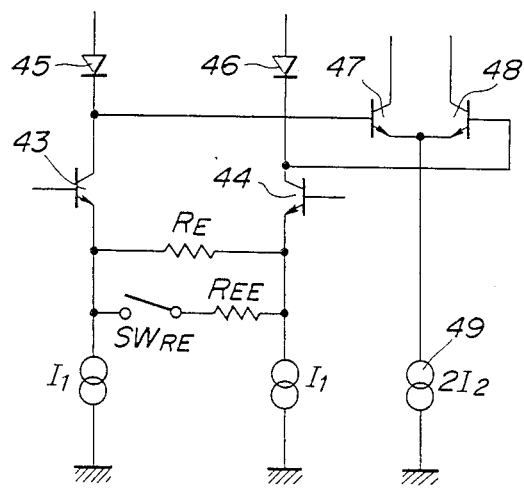

In the typical circuit shown in FIG. 15, a series circuit consisting of a switch $SW_{RE}$ and a resistor $R_{EE}$ is connected in parallel with an emitter resistance $R_E$ of the input stage of the integrator. The switch $SW_{RE}$ is turned off and on for normal operation and for filter adjustment, respectively, for commutating the mutual conductance. During the normal operation with the switch $SW_{RE}$ being turned off, the cut-off frequency $f_{C1}$ is given by $$f_{C1} = \frac{I_2}{2\pi C R_E I_1}$$

and, during the filter adjustment, the switch $SW_{RE}$ being turned on, the cutt-off frequency $f_{C2}$ is given by $$f_{C2} = \frac{I_2}{2\pi C(R_E // R_{EE}) I_1}$$

$$\text{where } R_E // R_{EE} = \frac{R_E R_{EE}}{R_E + R_{EE}}.$$

Figure 16:
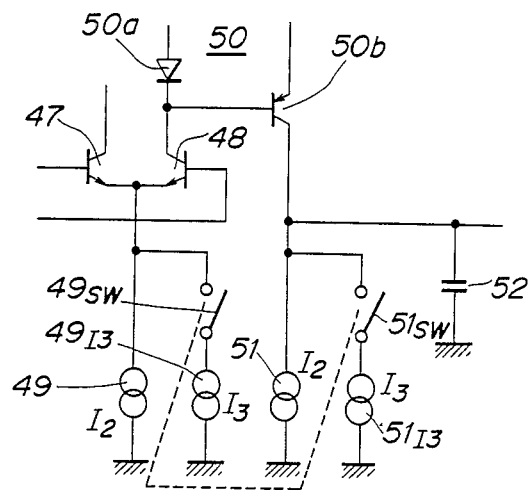
Figure 17:
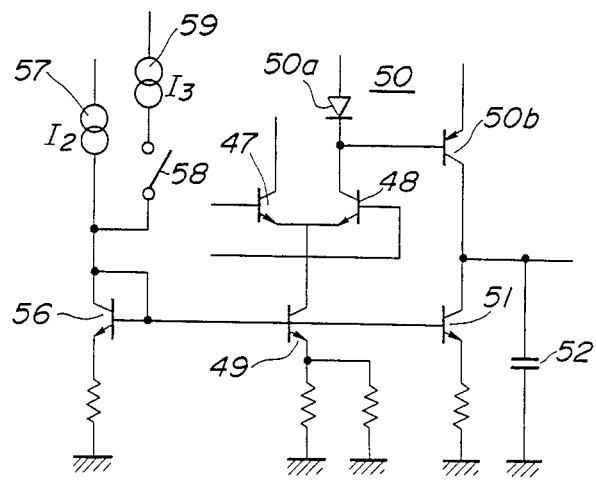

In the examples of FIGS. 16 and 17, the current ratio $I_2/I_1$ is commutated to change the above gain. First, in the circuit shown in FIG. 16, a series circit consiting of a switch $49_{SW}$ and a constant current source $49_{I3}$ of a current magnitude $I_3$ is connected in parallel with the constant current source 49, while a series circuit consisting of a switch $51_{SW}$ and a constant current source $51_{I3}$ of a current magnitude $I_3$ is connected in parallel with the constant current source 51. The switches $49_{SW}$ and $51_{SW}$ are interlocked so that they are simultaneously turned off during the normal operation and simultaneously turned on during the filter adjustment. The constant current sources 49, 51 are usually configured as the current mirror circuits. Referring to FIG. 17, a series circuit consisting of a switch 58 and a constant current source 59 of a current magnitude $I_3$ is connected in parallel with a constant current source 57 of the current magnitude $I_2$ connected to an input side transistor 56 constituting a current mirror circuit along with transistors 49, 51 of respective constant current sources, with the switch 58 being adapted to be turned on and off during standby and during the filter adjustment, respectively. The cut-off frequency $f_{C1}$ for standby is given by $$f_{C1} = \frac{I_2}{2\pi C R_E I_1}$$

while the cut-off frequency $f_{C2}$ for filter adjustment with the switch $SW_{RE}$ turned off is turned by $$f_{C2} = \frac{I_2 + I_3}{2\pi CR_E I_1}$$

The above described commutation of the internal circuit of the integrator may be performed for one or both of the two integrators constituting the aforementioned biquad filter.

It is to be noted that the frequency shifting by the commutation of the internal circuits may be achieved not only in the case of the LPF but in various other filters, such as BPF HPF or trap filters, and that the circuit may be easily adapted to automatic adjustment with the use of the buses.

It is also possible to envisage various combinations of the filter characteristics of the filters 2A and 2B constituting the filter circuit 2 of FIG. 12.

Figure 18A:
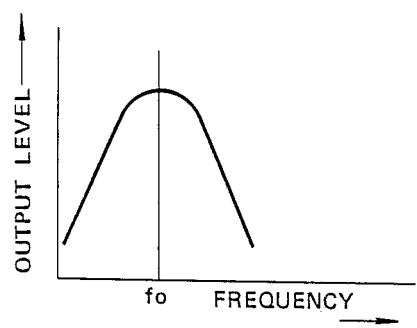
FIGS. 18 to 20 are charts showing frequency characteristics for explaining the main operation of modified embodiments.
Figure 18B:
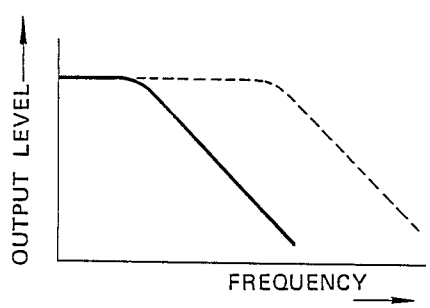
Figure 18C:
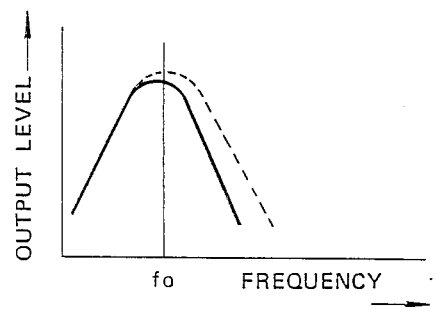

For example, when using the bandpass filter having the frequency characteristics shown in FIG. 18A as the first filter 2A and using the lowpass filter having the frequency characteristics shown by the solid line in FIG. 18B as the second filter 2B, the combined filter characteristics are as shown by the solid line in FIG. 18C, such that it become difficult to ascertain the peak frequency $f_0$. Therefore, during the mode of the filter adjustment, the characteristics of the second filter 2B are commutated similarly to the preceding embodiment for shifting the cut-off frequency drastically towards the high frequency side, as shown by the broken line in FIG. 18B, such that the characteristics of the first filter 2A are displayed substantially directly as the characteristics of the filter circuit 2, as indicated by the broken line in FIG. 18C.

Figure 19A:
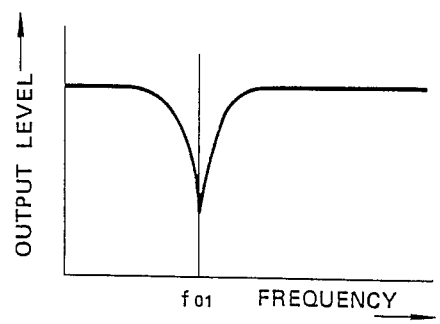
Figure 19B:
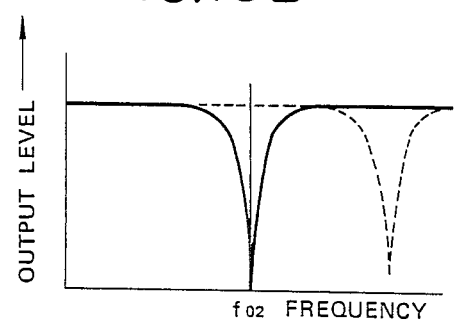
Figure 19C:
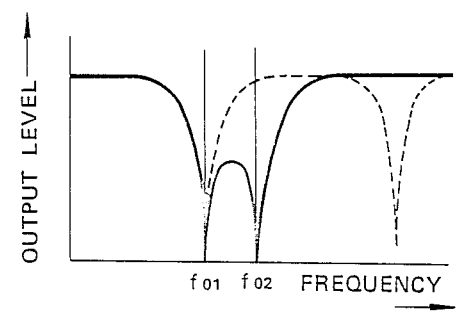

FIGS. 19A, B and C illustrate the characteristics of the filters 2A and 2B of the filter circuit 2 having trap characteristics and the dip frequencies $f_{01}$, $f_{02}$, respectively, and the combined characteristics of these filters. The characteristics of the filter 2B are commutated for shifting the dip towards, for example, the high frequency side, as shown by the broken line in FIG. 19B, whereby the dip portion proper to the characteristics of the filter 2A are displayed substantially directly as the combined characteristics of the filter circuit 2, as indicated by the broken line in FIG. 19C.

Figure 20:
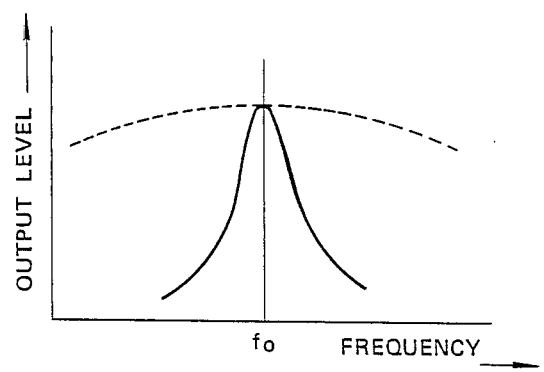

When both of the two filters are bandpass filters or at least one of the filters is the combination of the BPF and the trap filter, it is also possible to reduce the value of Q (quality factor) of the BPF and to commutate the acute peak curve shown by the solid line in FIG. 20 to a more gentle curve shown by the broken line therein to render the characteristic curve of the other filter more explicit.

Figure 21:
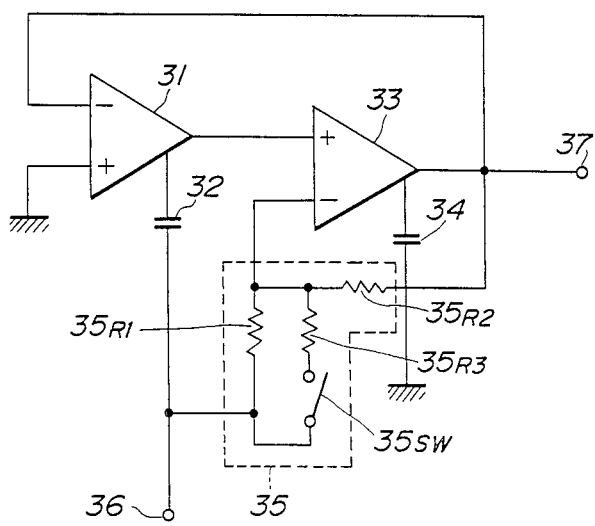
FIG. 21 is a circuit diagram showing essential parts of the embodiment shown in FIG. 20.

FIG. 21 illustrates a typical circuit for commutating the Q of the BPF.

In this figure, parts or components equivalent to those of the biquad filter shown in FIG. 3 are indicted by the same reference numerals and the corresponding description is omitted for simplicity. A feedback circuit 35 is constituted by a voltage divider consisting of resistors $35_{R1}$ and $35_{R2}$, with the resistor $35_{R2}$ being connected to an output terminal of an operational amplifier 33 and with the divided voltage output of the resistors $35_{R1}$, $35_{R2}$ being fed back to the inverting input terminal of the operational amplifier 33. As the means for changing the commutating the Q, a series circuit consisting of a resistor $35_{R3}$ and a switch $35_{SW}$ is connected in parallel with the resistor $35_{R1}$. The feedback factor of the feedback circuit 35 is commutated in dependence upon the turning on and off of the switch 35sw for commutating the value of Q or $1/\beta$. Thus, with the resistances of the resistors $35_{R1}$, $35_{R2}$ and $35_{R3}$ of $R_1$, $R_2$ and $R_3$, respectively, the value of $Q_{OFF}$ for the switch $35_{SW}$ being turned off and that of $Q_{ON}$ for the switch $35_{SW}$ being turned on are given by $$Q_{OFF} = \frac{R_1 + R_2}{R_1}$$

and $$Q_{ON} = \frac{(R_1//R_3) + R_2}{R_1//R_3}$$

wherein $R_1//R_3 = \frac{R_1 R_3}{R_1 + R_3}$.

Since $Q_{ON} > Q_{OFF}$, the switch $35_{SW}$ is turned on during the standby time to realize the PFF having the prescribed high Q and turned off during the filter adjustment to lower the value of Q as indicated by the broken line in FIG. 20 to increase the curvature of the characteristic curve to thereby demonstrate the characteristic portion proper to the other filter to facilitate the filter adjustment.

FIG. 22 illustrates a further modified embodiment of the present invention wherein DA converters 14A, 14B and latch circuits 13A, 13B are separately provided to each of the filters 2A and 2B of the filter circuit 2. The circuit shown in FIG. 22 is otherwise the same as that shown in FIG. 1 so that the corresponding parts are indicated by the same reference numerals and the corresponding description is omitted for simplicity.

In the present modified embodiment, the filter adjustment data of the respective filters 2A and 2B can be adjusted separately, a predetermined offset may be annexed to the filter adjustment data of one of the filter 2B for realizing the aforementioned changing or commutation of the filter characteristics. After termination of the filter adjustment, the obtained optimum adjustment data may be used as the data for the filters 2A and 2B in consideration of the high relative accuracy of the components of the same integrated circuit.

The present invention is not limited to the above described specific embodiments, but may comprise various other modifications. For example, the present invention may be easily adapted to a series circuit including three or more filters. It is also possible to change or modify various filter characteristics drastically including shifting the cut-off frequency of the highpass filter towards the low frequency side for thereby demonstrating the portion characteristic of the other filter more explicitly.

What is claimed is:

1. A filter adjustment apparatus for adjusting frequency characteristics of a filter comprising:
   a filter having characteristics which are adjusted by adjustment data;
   means for supplying said adjustment data to said filter;
   a signal processing circuit connected in series with said filter; and
   means for setting said signal processing circuit to a state of not influencing said filter, said setting means including switch means for bypassing said signal processing circuit.

2. The apparatus according to claim 1, wherein said signal processing circuit is another filter.

3. A filter adjustment apparatus comprising:
a first filter, having characteristics which are adjusted by with adjustment data,
a second filter connected in series with said first filter; and
means for setting said second filter to a state of not influencing the filter characteristics of said first filter during adjustment of said first filter, and means for changing the filter characteristics of said second filter so as to make the output of the series circuit including said first and second filters independent of the influence of said second filter.

4. The apparatus according to claim 3, wherein the means for changing the filter characteristics comprises means for commutating a circuit constant of said second filter.

5. The apparatus according to claim 3, wherein said first filter is a trap type filter and said second filter is a low pass filter.

6. The apparatus according to claim 3, wherein said first filter is a bandpass filter and said second filter is a lowpass filter.

7. The apparatus according to claim 3, wherein both said first and second filters are trap type filters.

8. The apparatus according to claim 3, wherein said second filter includes an integrator and a capacitor.

9. The apparatus according to claim 3, wherein the Q of said second filter is variable.

10. A filter adjustment circuit comprising:
a memory storing filter adjustment data;
a bus line for transmitting said data;
a latch connected to said bus line and to which said data are supplied through said bus line;
a D/A converter for D/A conversion of data obtained from said latch circuit;
a series circuit including a first filter and a second filter connected in series, each of said filters having characteristics which are adjusted by the output of said D/A converter,
an input terminal for a constant frequency signal supplied to one of said filters;
means for by-passing one of said first and second filters, one of said first and second filters being by-passed when the other filter is adjusted and said constant frequency signal is supplied to said input terminal; and
means connected to the output of said series circuit while said constant frequency is being supplied for manifesting the affect on said series circuit while said other filter is adjusted.

11. The apparatus according to claim 10, wherein said bypass means includes a bypass line connected in parallel with said second filter and a switch circuit for selecting either said bypass line or said second filter.

12. The apparatus according to claim 11, wherein said switch circuit is controlled by control signals supplied through said bus line.

13. A method for adjusting a filter comprising the steps of:
supplying a constant frequency signal to an upstream side of a filter and a signal processing circuit connected in series to each other;
by-passing said signal processing circuit, and
supplying adjustment data to said filter to adjust a characteristic of said filter, while said signal processing circuit is being bypassed.

14. The method according to claim 13, wherein said signal processing circuit is another filter.

15. The method according to claim 13, wherein said filter and said signal processing circuit are formed in one IC and said adjustment data are supplied to said filter through an external bus line of said IC.

16. A method for adjusting a filter comprising:
supplying a constant frequency signal to an upstream side of a first filter and a second filter connected in series with each other;
changing a characteristic of one of said first and said second filters such that said one filter does not influence the response of the other filter to adjustment signals supplied thereto; and
supplying said adjustment signals to said other filter to adjust the characteristics of said other filter.

17. The method according to claim 16, wherein said one filter and said other filter are formed in on IC and said adjustment data are supplied to said other filter through an external bus line of said IC.

* * * * *